United States Patent [19]

Sugata et al.

[11] Patent Number: 4,804,974
[45] Date of Patent: Feb. 14, 1989

[54] THERMAL RECORDING HEAD

[75] Inventors: Masao Sugata, Yokohama; Tatsuo Masaki, deceased, late of Yokohama, by Yoshiko Masaki, legal successor; Hirokazu Komuro; Shinichi Hirasawa, both of Hiratsuka; Yasuhiro Yano, Kawasaki, all of Japan

[73] Assignee: Canon Kabushiki Kaisha, Tokyo, Japan

[21] Appl. No.: 16,509

[22] Filed: Feb. 17, 1987

Related U.S. Application Data

[63] Continuation of Ser. No. 841,267, Mar. 19, 1986, abandoned.

[30] Foreign Application Priority Data

| Mar. 23, 1985 | [JP] | Japan | 60-58847 |
| Mar. 25, 1985 | [JP] | Japan | 60-58530 |
| Mar. 25, 1985 | [JP] | Japan | 60-58532 |
| Mar. 26, 1985 | [JP] | Japan | 60-59392 |

[51] Int. Cl.⁴ ............................................. G01D 15/10
[52] U.S. Cl. ................................. 346/76 PH; 400/125
[58] Field of Search ................. 400/120 PH; 219/216, 219/216 PH, 543; 338/308, 314; 346/76 PH

[56] References Cited

U.S. PATENT DOCUMENTS

| 3,301,707 | 1/1967  | Loeb et al. .              |
| 3,604,970 | 9/1971  | Culbertson et al. .        |
| 3,639,165 | 2/1972  | Rairden .                  |
| 3,645,783 | 2/1972  | Rupert et al. .            |
| 4,036,786 | 7/1977  | Tiedeman .                 |
| 4,060,660 | 11/1977 | Carlson et al. .           |
| 4,172,718 | 10/1979 | Menzel .                   |
| 4,296,309 | 10/1981 | Shinmi et al. ...... 219/216 |
| 4,361,638 | 11/1982 | Higashi et al. .           |
| 4,400,410 | 8/1983  | Green et al. .             |
| 4,414,274 | 11/1983 | Hieber .                   |
| 4,436,797 | 3/1984  | Brady et al. .             |
| 4,522,663 | 6/1985  | Ovshinsky et al. .         |
| 4,567,493 | 1/1986  | Ikeda et al. .             |
| 4,568,626 | 2/1986  | Ogawa .                    |
| 4,585,704 | 4/1986  | Hirai .                    |
| 4,595,822 | 6/1986  | Nishiguchi et al. ...... 219/216 PH |
| 4,597,844 | 7/1986  | Hiraki .                   |
| 4,629,514 | 12/1986 | Suda .                     |

FOREIGN PATENT DOCUMENTS

| 0071082 | 2/1983  | European Pat. Off. .     |
| 3411702 | 10/1984 | Fed. Rep. of Germany .   |
| 3316182 | 11/1984 | Fed. Rep. of Germany .   |
| 3041420 | 1/1985  | Fed. Rep. of Germany .   |
| 49521   | 5/1981  | Japan .                  |
| 42472   | 3/1983  | Japan .                  |
| 42473   | 3/1983  | Japan .                  |
| 1410876 | 10/1975 | United Kingdom .         |
| 1582231 | 1/1981  | United Kingdom .         |
| 2083841 | 3/1982  | United Kingdom .         |
| 2109012 | 5/1983  | United Kingdom .         |

Primary Examiner—E. A. Goldberg
Assistant Examiner—Huan H. Tran
Attorney, Agent, or Firm—Fitzpatrick, Cella, Harper & Scinto

[57] ABSTRACT

A thermal recording head comprises a heating resistor layer and at least a pair of electrodes electrically connected to said heating resistor layer, at least one combination of said heating resistor layer and said at least a pair of electrodes being formed on a substrate, wherein said heating resistor layer essentially consists of an amorphous material containing carbon atoms as a major constituent and halogen atoms.

30 Claims, 4 Drawing Sheets

THERMAL RECORDING HEAD

This application is a continuation of application Ser. No. 841,267 filed Mar. 19, 1986, now abandoned.

BACKGROUND OF THE INVENTION

1. Field of the Invention

The present invention relates to a thermal recording head used in a recording system using thermal energy.

2. Related Background Art

Since a conventional recording system utilizing thermal energy is based on nonimpact recording, the noise level is very low in such a system. In addition, this system can perform color recording and thus has received a great deal of attention in recent years.

In the conventional recording system, recording information is transmitted as an electrical signal to a thermal recording head, i.e., electro-thermal conversion elements. In each electro-thermal conversion element, a heating resistor layer is formed on a substrate and at least a pair of electrodes are connected to the heating resistor layer. In this context, "substrate" means a carrier for the heating resistor layer. The substrate can be prepared by forming a proper layer on a support. Since the thermal recording head is generally compact, the heating resistor layer comprises a thin film, a thick film or a semiconductor film. In particular, since a thin film type resistor layer requires lower power consumption than other types and has good thermal response, a thin film is preferable as a constituting element of the thermal recording head, and its applications are increasing.

Good thermal response for a given electrical signal, high thermal conductivity, good heat resistance against self thermal dissipation, high durability against various factors (e.g., thermal history), etc. are required as properties of the heating resistor layer for a thermal recording head. Furthermore, when a thermal recording head is brought into contact with a heat-sensitive sheet or a thermal transfer ink ribbon, it must have a small friction coefficient.

None of the conventional heating resistor layers of thermal recording heads is completely satisfactory. There is much room for further improvements in the various properties of the heating resistor layer enumerated above.

In a conventional thermal recording head, an antiwear layer is formed on the surface of the heating resistor layer to improve the antiwear property. In this case, thermal response is often sacrificed.

In a conventional thermal recording head, when recording is performed on a recording medium such as a sheet with a rough surface, the thermal recording head must be brought into tight contact with the recording medium at a high pressure if characters must be recorded in complete dot shapes. The thermal recording head wear is therefore considerable. Demand has therefore arisen for further improvement in the antiwear properties of thermal recording heads.

SUMMARY OF THE INVENTION

It is an object of the present invention to provide a thermal recording head having a heating resistor layer with improved thermal response.

It is another object of the present invention to provide a thermal recording head having a heating resistor layer with an improved thermal conductivity.

It is still another object of the present invention to provide a thermal recording head having a heating resistor layer with improved heat resistance.

It is still another object of the present invention to provide a thermal recording head having a heating resistor layer with improved durability.

It is still another object of the present invention to provide a thermal recording head having a heating resistor layer with an improved antiwear property.

It is still another object of the present invention to provide a thermal recording head having a heating resistor layer with a low friction coefficient.

According to the present invention, there is provided a thermal recording head having, on a substrate, at least one combination of a heating resistor layer and at least one pair of electrodes electrically connected to the heating resistor layer, wherein the heating resistor layer comprises an amorphous material containing carbon atoms as a major constituent and halogen atoms.

DETAILED DESCRIPTION OF THE PREFERRED EMBODIMENTS

The present invention will be described in detail with reference to the accompanying drawings.

Figure 1:
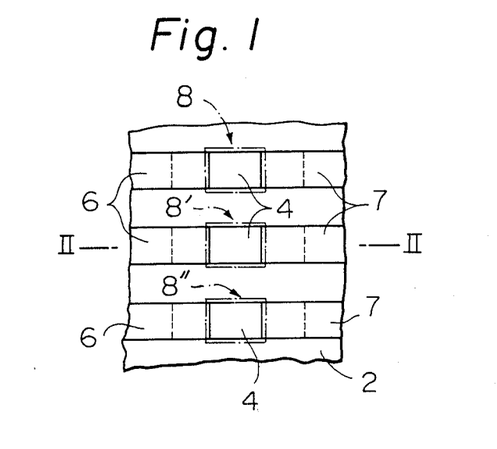
FIG. 1 is a plan view showing part of a thermal recording head according to an embodiment of the present invention.
Figure 2:
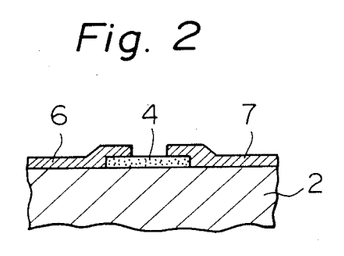
FIG. 2 is a sectional view of the thermal recording head of FIG. 1 taken along the line II—II thereof.

FIG. 1 is a plan view showing part of a thermal recording head according to an embodiment of the present invention, and FIG. 2 is a sectional view thereof taken along the line II—II.

Referring to FIGS. 1 and 2, a plurality of combinations each consisting of a heating resistor layer 4 and a pair of electrodes 6 and 7 are formed on a support 2 (a substrate in this embodiment) to constitute dot-like effective heating portions 8, 8', 8", . . . , as shown in FIG. 1. The heating portions 8, 8', 8", . . . are linearly arranged at predetermined intervals. During the use of the thermal recording head, the heating resistor layers 4 are brought into tight contact with a heat-sensitive sheet or a thermal transfer ink ribbon and are fed along the direction II—II relative to the heat-sensitive sheet or the thermal transfer ink ribbon. Electrical signals of recording information are properly supplied to the heating resistor layers 4 constituting the heating portions 8, 8', 8", . . . through the corresponding electrodes 6 and 7. The heating portions are heated in response to the corresponding signals, and thermal energy allows heat-sensitive or thermal transfer recording.

A material of the support 2 is not limited in the present invention. However, in practice, the material preferably has good adhesion property with the heating resistor layer 4 and the electrodes 6 and 7, which all are formed thereon, and good thermal resistance against heat upon formation of the heating resistor layer 4 and the electrodes 6 and 7 and against dissipated therefrom. The support 2 preferably has a higher electrical resistance than that of the heating resistor layer 4 formed thereon. The material of the support 2 must have a good thermal conductivity to provide sufficient thermal energy to the recording medium and not to degrade the response characteristics to an electrical input.

The material of the support 2 can be exemplified by an inorganic material (e.g., glass, ceramics, or silicon) or an organic material (e.g., polyamide resins or polyimide resins).

The heating resistor layer 4 comprises an amorphous material containing carbon atoms as a major constituent and halogen atoms. The halogen atoms are selected from F, Cl, Br and I atoms. These types of atoms can be used singly or in combination. F and Cl are preferred as halogen atoms, and F is most preferred.

The content of halogen atoms in the heating resistor layer 4 can be properly selected to obtain desired characteristics according to the application purpose of the resistor. However, it is preferably 0.0001 to 30 atm %, more preferably 0.005 to 20 atm %, and most preferably 0.001 to 10 atm %.

The heating resistor layer 4 comprising an amorphous material containing carbon atoms as a major constituent and halogen atoms (to be also referred to as "a-C:X" (wherein X represents halogen atoms) hereinafter) is formed by plasma CVD (e.g., glow discharge) or vacuum deposition (e.g., sputtering).

In order to form an a-C:X resistor layer 4 by glow discharge, basically, the substrate 2 is placed in a film forming chamber at a reduced pressure. A C source gas for supplying carbon atoms (C) and an X source gas for supplying halogen atoms (X) are introduced in the film forming chamber. Glow discharge is then generated in the film forming chamber by using RF or microwave power, thereby forming the a-C:X layer on the surface of the substrate.

In order to form an a-C:X resistor layer 4 by sputtering, basically, the substrate 2 is placed in a film forming chamber at a reduced pressure. A C-based target is sputtered in an atmosphere of an inert gas such as Ar or He, or a gas mixture mainly containing Ar or He, while an X source gas is supplied to the film forming chamber.

In order to improve control of the resistance of the heating resistor layer prepared according to the present invention, the heating resistor layer may contain not only halogen atoms but also a material for controlling an electrical conductivity.

The material for controlling the electrical conductivity can be exemplified by an impurity in the field of semiconductors, e.g., a p-type impurity for providing a p-type conductivity for carbon, or an n-type impurity for providing an n-type conductivity for carbon. The p-type impurity includes Group III atoms such as B, Al, Ga, In and Tl. Among these impurity atoms, B and Ga are preferable. The n-type impurity includes Group V atoms such as P, As, Sb and Bi. Among these impurity atoms, P and As are preferable. These impurity atoms can be used singly or in a combination.

The content of the electrical conductivity control material in the resistor layer 4 can be properly selected to obtain desired properties according to the application purpose of the resistor. However, it is preferably 0.01 to 50,000 atomic ppm, more preferably 0.5 to 10,000 atomic ppm, and most preferably 1 to 5,000 atomic ppm. In this case, the content of halogen atoms can fall within the range described above.

An amorphous material containing carbon atoms as a major constituent, halogen atoms, and an electrical conductivity control material is also referred to as "a-C:X(p,n)" wherein X represents halogen atoms, and (p,n) represents the electrical conductivity control material. An a-C:X(p,n) heating resistor layer 4 can be formed by plasma CVD (e.g., glow discharge) or vacuum deposition (e.g., sputtering) in the same manner as described above.

The process for forming the a-C:X(p,n) resistor layer 4 by glow discharge is basically the same as the process for forming the a-C:X resistor layer 4. In the case of a-C:X(p,n), an electrical conductivity control material gas is also supplied as a source gas. In the process for forming the a-C:X(p,n) resistor layer by sputtering, the electrical conductivity control material gas is added to the a-C:X source gas to form the a-C:X(p,n) layer as in the formation of the a-C:X resistor layer.

According to the present invention, the distribution of halogen atoms and the electrical conductivity control material may be made nonuniform so as to obtain more desired properties such as a heat accumulation property, a heat dissipation property, and adhesion strength between the substrate and the resistor layer.

The distribution of halogen atoms and/or the electrical conductivity control material in the heating resistor layer 4 may be nonuniform along a direction of thickness. The content of the halogen atoms and/or the electrical conductivity control material in the heating resistor layer 4 may be increased or decreased from the substrate 2 side to the upper surface side. The content of the halogen atoms and/or the electrical conductivity control material can have a maximum or minimum value in the heating resistor layer. In this manner, the content of the halogen atoms and/or the electrical conductivity control material along the direction of thickness of the layer 4 can be desirably changed to provide desired properties.

FIGS. 6 to 11 show changes in content of halogen atoms and/or the electrical conductivity control material along the direction of thickness of the heating resistor layer 4 in the thermal recording head according to the present invention. A distance T from an interface between the substrate 2 and the heating resistor layer 4 is plotted along the ordinate, and t represents the thickness of the heating resistor layer 4. The content C of halogen atoms and/or the electrical conductivity control material is plotted along the abscissa. The scales of ordinates (T) and abscissas (C) are not identical but are modified to best illustrate the features of the respective graphs. Various distributions corresponding to differences based on the actual values are used in practice. The distribution states of respective atomic kinds, of course, may differ from one another.

In order to form a heating resistor layer with a nonuniform distribution of content of halogen atoms and/or electrical conductivity control material, the glow discharge or sputtering can be used. In this case, in order to nonuniformly distribute the selected materials, the discharge power and the supply amount of the source gas are changed as needed.

In the above process, materials for the C as source gas, the X source gas, and the electrical conductivity control source gas can be used which is in gaseous state at ambient pressure at room temperature, or at a reduced pressure.

Examples of the C materials may include saturated hydrocarbons with 1 to 5 carbon atoms, hydrocarbons of ethylene series with 2 to 5 carbon atoms, hydrocarbons of acetylene series with 2 to 4 carbon atoms and aromatic hydrocarbons. More specifically, the saturated hydrocarbons may include methane ($CH_4$), ethane ($C_2H_6$), propane ($C_3H_8$), n-butane (n-$C_4H_{10}$) and pentane ($C_5H_{12}$). The hydrocarbons of ethylene series may include ethylene ($C_2H_4$), propylene ($C_3H_6$), butene-1 ($C_4H_8$), butene-2 ($C_4H_8$), isobutylene ($C_4H_8$) and pentene ($C_5H_{10}$). The hydrocarbons of acetylene series may include acetylene ($C_2H_2$), methylacetylene ($C_3H_4$), and butyne ($C_4H_6$). Aromatic hydrocarbons may include benzene ($C_6H_6$).

Examples of the X materials may include halogens, halides, compounds of halogens, and halogen-substituted hydrocarbon derivatives. More particularly, the halogens may include $F_2$, $Cl_2$, $Br_2$ and $I_2$. The halides may include HF, HCl, HBr, and HI. The compounds of halogens may include BrF, ClF, $ClF_3$, $BrF_5$, $BrF_3$, $IF_3$, $IF_7$, ICl, and IBr. The halogen-substituted hydrocarbon derivatives may include $CF_4$, $CHF_3$, $CH_2F_2$, $CH_3F$, $CCl_4$, $CHCl_3$, $CH_2Cl_2$, $CH_3Cl$, $CBr_4$, $CHBr_3$, $CH_2Br_2$, $CH_3Br$, $CI_4$, $CHI_3$, $CH_2I_2$, and $CH_3I$.

Examples of the electrical conductivity control material may include the following materials.

Examples of Group III atom materials may include: boron atom sources such as boron hydroxides (e.g., $B_2H_6$, $B_4H_{10}$, $B_5H_9$, $B_5H_{11}$, $B_6H_{10}$, $B_6H_{12}$, and $B_6H_{14}$) and boron halides (e.g., $BF_3$, $BCl_3$, and $BBr_3$); and other atom sources such as $AlCl_3$, $GaCl_3$, $Ga(CH_3)_3$, $InCl_3$, and $TlCl_3$.

Examples of Group V atom materials may include: phosphorus atom sources such as phosphorus hydroxides (e.g., $PH_3$ and $P_2H_4$) and phosphorus halides (e.g., $PH_4I$, $PF_3$, $PF_5$, $PCl_3$, $PCl_5$, $PBr_3$, $PBr_5$, and $PI_3$); and other atom sources such as $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, and $BiBr_3$.

These materials may be used singly or in combination.

In the process for forming the heating resistor layer, in order to control the contents of halogen atoms and electrical conductivity control material in the resistor layer 4 and the properties of the resistor layer 4, substrate temperature, amounts of source gases, discharge power and pressure in the film forming chamber must be properly selected.

In particular, in order to prepare a heating resistor layer 4 wherein the distribution of halogen atoms and/or electrical conductivity control material is nonuniform along the direction of thickness of the layer 4, the amount of halogen atoms and/or electrical conductivity control material supplied to the film forming chamber is preferably controlled by valves over time.

The substrate temperature preferably falls within the range of 20° to 1,500° C., more preferably 30° to 1,200° C., and most preferably 50° to 1,100° C.

The amounts of source gases to be fed are properly determined in accordance with the desired heating resistor layer properties and a film forming rate.

The discharge power is preferably 0.001 to 20 W/cm$^2$, more preferably 0.01 to 15 W/cm$^2$, and most preferably 0.05 to 10 W/cm$^2$.

The pressure in the film forming chamber is preferably $10^{-4}$ to 10 Torr, and more preferably $10^{-2}$ to 5 Torr.

The thermal recording head heating resistor layer prepared by the process described above has properties similar to those of a diamond. More specifically, the resistor layer has a Vickers hardness of 1,800 to 5,000, a thermal conductivity of 0.3 to 2 cal/cm·sec·°C., a resistivity of $10^5$ to $10^{11}$ Ω·cm, a thermal expansion coefficient of $2 \times 10^{-5}$ to $10^{-6}$/° C., a friction coefficient of 0.15 to 0.25, and a density of 1.5 to 3.0. Since the halogen atoms are contained in the resistor layer, the layer is chemically and thermally stable. Furthermore, when the resistor layer includes halogen atoms and electrical conductivity control material, the resistance of the layer can be easily controlled.

Since the resistor layer 4 in the thermal recording head had a good antiwear property, the resistor layer 4 can be made very thin. Furthermore, a special antiwear layer is not required, and good thermal response can be obtained.

A protective or other function layer may be formed on the heating resistor layer 4 of the thermal recording head of the present invention. For example, a protective layer can be formed on the heating resistor layer 4 to further improve durability of the thermal recording head.

Figure 3:
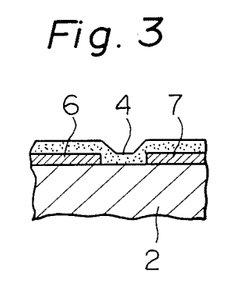
FIGS. 3 and 4 are sectional views of thermal recording heads according other embodiments of the present invention, respectively.

In the above embodiment, the heating resistor layer and the electrodes are sequentially formed on the substrate in the order named. However, in the thermal recording head of the present invention, the electrodes and the heating resistor layer may be formed on the substrate in the order named, as shown in FIG. 3. Referring to FIG. 3, the thermal recording head has a support (a substrate in this embodiment) 2, a heating resistor layer 4, and a pair of electrodes 6 and 7. Since the heating resistor layer 4 of good durability is located on the side of the recording medium, an antiwear layer need not be formed to obtain a thermal recording head with high performance.

Figure 4:
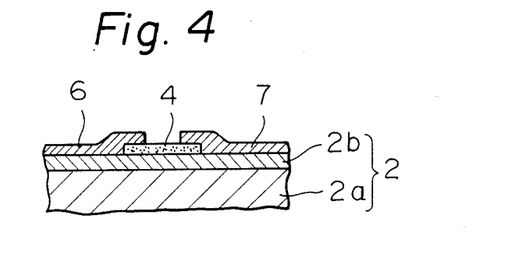

In the above embodiments of the present invention, the substrate comprises a simple support 2. However, the substrate may be a bulk substrate, as shown in FIG. 4. A substrate 2 consists of a support 2a and a surface layer 2b. A support material described with reference to FIG. 1 or a metal may be used as the support 2a. The surface layer 2b may be made of a material having good adhesion with the resistor layer 4 formed thereon. The surface layer 2b, for example, consists of an amorphous material containing carbon atoms as a major constituent, or of a conventional oxide. The surface layer 2b is deposited using a proper material on the support 2a according to a technique similar to formation of the above-mentioned heating resistor layer. The surface layer 2b may be a conventional glass glazed layer.

The electrodes 6 and 7 in the thermal recording head may be made of an electrically conductive material such as Au, Cu, Al, Ag or Ni.

A method of manufacturing a thermal recording head according to the present invention will be schematically described.

Figure 5:
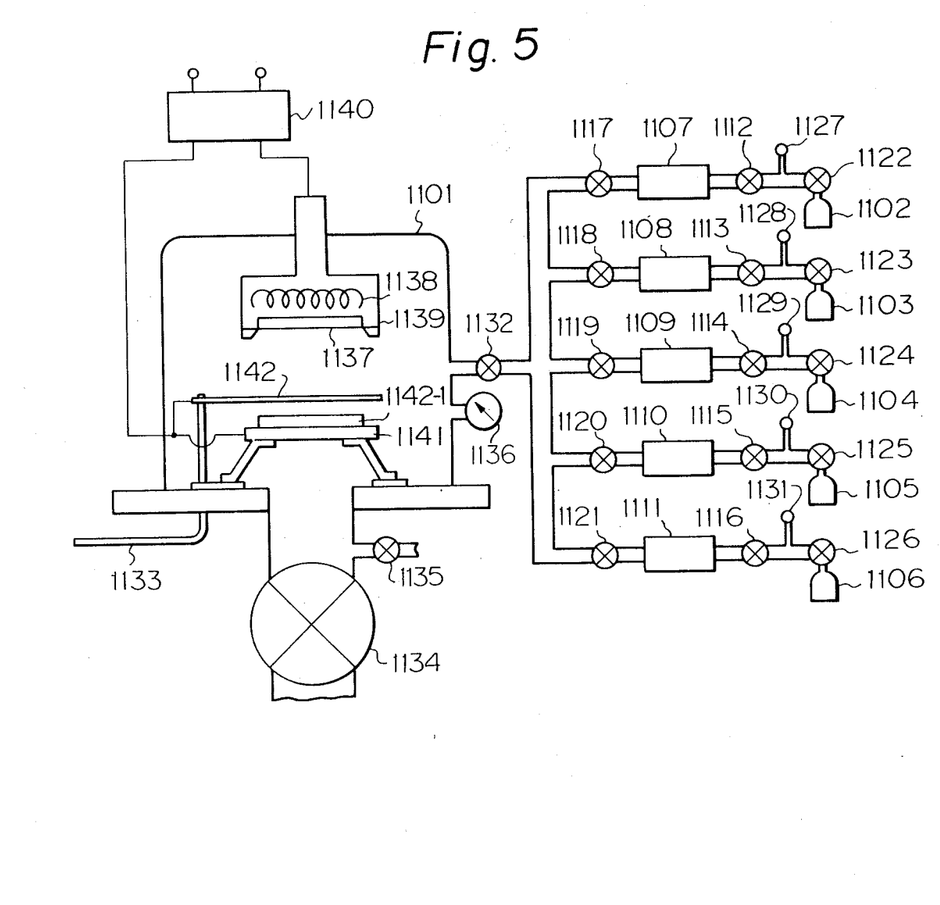
FIG. 5 is a system diagram of an apparatus for manufacturing the thermal recording heads of the present invention.
Figure 6:
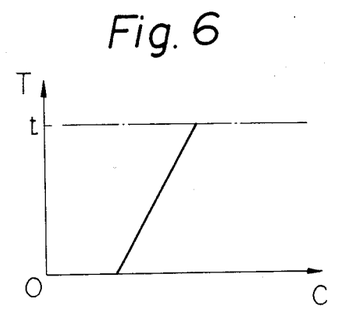
FIGS. 6 to 11 are graphs showing distributions of contents of halogen atoms in heating resistor layers, respectively.
Figure 7:
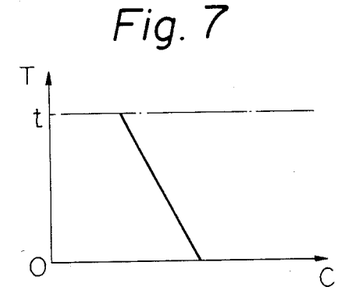
Figure 8:
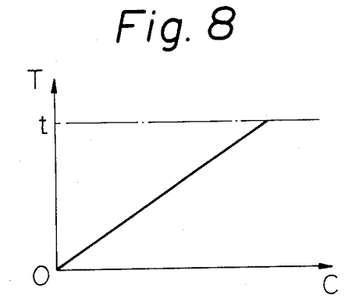
Figure 9:
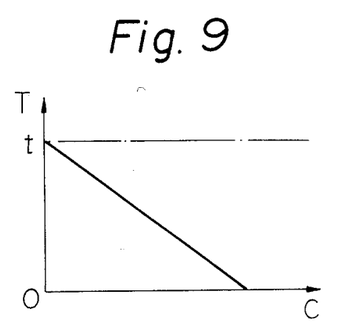
Figure 10:
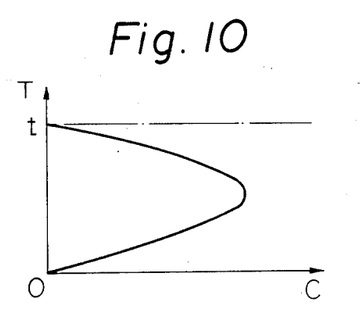
Figure 11:
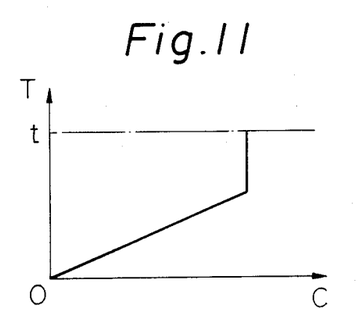

FIG. 5 is a schematic system diagram of an apparatus for forming the heating resistor layer on the surface of the substrate. The apparatus includes a film forming chamber 1101, gas bombs 1102 to 1106, mass flow controllers 1107 to 1111, supply valves 1112 to 1116, exhaust valves 1117 to 1121, gas bomb valves 1122 to 1126, outlet port pressure gauges 1127 to 1131, an auxiliary valve 1132, a lever 1133, a main valve 1134, a leak valve 1135, a vacuum meter 1136, a substrate material 1137 of a thermal head to be prepared, a heater 1138, a substrate support means 1139, a high-voltage source 1140, an electrode 1141, and a shutter 1142. A target 1142-1 is mounted on the electrode 1141 during sputtering.

Ar-diluted $CF_4$ gas (99.9% purity or higher) is sealed in the gas bomb 1102, and Ar-diluted $C_2F_6$ gas (99.9% purity or higher) is sealed in the gas bomb 1103. Prior to supply of these gases from the bombs to the film forming chamber 1101, the operator must confirm that the valves 1122 to 1126 of the gas bombs 1102 to 1106 and the leak valve 1135 are closed. The operator also confirms that the supply valves 1112 to 1116, the exhaust valves 1117 to 1121, and the auxiliary valve 1132 are opened. The main valve 1134 is opened to evacuate the film forming chamber 1101 and the gas pipes. When reading of the vacuum meter 1136 indicates $1.5 \times 10^{-6}$ Torr, the auxiliary valve 1132, the supply valves 1112 to 1116, and the exhaust valves 1117 to 1121 are closed. Thereafter, the gas pipe valves connected to the gas bombs are opened to supply desired gases to the film forming chamber 1101.

The process for forming a resistor layer of a thermal recording head of the present invention by glow discharge will be exemplified using the apparatus described above. The valve 1122 is opened to cause $CF_4/Ar$ gas to flow out from the gas bomb 1102, and a pressure of the outlet port pressure gauge 1127 is set at 1 kg/cm$^2$. The supply valve 1112 is gradually opened to cause the gas to flow in the mass flow controller 1107. Subsequently, the exhaust valve 1117 and the auxiliary valve 1132 are gradually opened to supply the $CF_4/Ar$ gas in the film forming chamber 1101. Then, the mass flow controller 1107 is controlled such that the flow of the $CF_4/Ar$ gas is set at a desired value. The operator must also adjust the opening of the main valve 1134 while he reads the vacuum meter 1136 such that the pressure in the film forming chamber 1101 is set at a desired value. The heater 1138 is energized such that the substrate 1137 supported by the supporting means 1139 in the film forming chamber 1101 is heated to a desired temperature. The shutter 1142 is opened to cause glow discharge in the film forming chamber 1101.

In order to obtain a nonuniform distribution of halogen atoms, the opening of the exhaust valve 1117 is changed manually or using an external drive motor to change the flow rate of $CF_4/Ar$ gas according to a predetermined change rate curve over time, thereby changing the content of F atoms in the resistor layer 4 along the direction of its thickness.

The process for forming a resistor layer of a thermal recording head according to the present invention by sputtering will be described using the apparatus described above. The high-purity graphite 1142-1 is placed on the electrode 1141 to which a high voltage is applied from the high-voltage source 1140. In the same manner as in glow discharge, the $CF_4/Ar$ gas is supplied from the gas bomb 1102 to the film forming chamber 1101 at a desired flow rate. The shutter 1142 is opened and the high-voltage source 1140 is turned on to sputter the target 1142-1. In this case, the substrate 1137 is heated by the heater 1138 to a desired temperature, and the opening of the main valve 1134 is controlled to set the internal pressure of the film forming chamber 1101 to a desired value in the same manner as in glow discharge.

In this case, even if a nonuniform distribution of halogen atoms is established, the opening of the exhaust valve 1117 is changed in the same manner as in glow discharge to change the flow rate of the $CF_4/Ar$ gas according to the predetermined change rate curve over time. Therefore, the content of F atoms in the resistor layer 4 can be changed along the direction of its thickness.

In order to add halogen atoms and an electrical conductivity control material to the heating resistor layer by using the apparatus shown in FIG. 3, Ar-diluted $CF_4$ gas (99.9% purity or higher) is sealed in the gas bomb 1102, Ar-diluted $BF_3$ gas (99.9% purity or higher) is sealed in the gas bomb 1103, and Ar-diluted $PF_5$ gas (99.9% purity or higher) is sealed in the gas bomb 1104. The valve of the gas pipe connected to the desired gas bomb is opened to supply the desired gas to the film forming chamber 1101.

The same procedures as described above are followed in glow discharge and sputtering to form a-C:X(p,n). In order to obtain a nonuniform distribution of halogen atoms and/or electrical conductivity control material, the flow rate of the source gas can be changed in the manner as described above.

In the thermal recording heads shown in FIGS. 1 and 2, formation of the heating resistor layer on the substrate by glow discharge or sputtering can be performed for substantially the entire surface of the substrate. Thereafter, a conductive layer is formed, and photolithography is utilized to etch the conductive layer and the heating resistor layer, thereby obtaining a thermal recording head with a plurality of dot-like effective heating sections shown in FIG. 1.

In the thermal recording head shown in FIG. 3, a conductive layer is preformed on the substrate, and photolithography is used to etch the conductive layer. Thereafter, the heating resistor layer is formed by glow discharge or sputtering on the substrate, as described above.

According to the present invention as described above, by using an amorphous material containing carbon atoms as a major constituent and halogen atoms to constitute the heating resistor layer, there is provided a high-performance thermal recording head with good thermal response, thermal conductivity, heat resistance and/or durability properties and further with chemical and thermal stabilities. In particular, according to the present invention, there is provided a thermal recording head with a heating resistor layer with a good antiwear property and/or a small friction coefficient.

In the present invention, the heating resistor layer comprises an amorphous material containing carbon atoms as a major constituent and an electrical conductivity control material. Therefore, a thermal recording head having good thermal response, thermal conductivity, thermal resistance, durability and resistance controllability is provided.

According to the present invention, the nonuniform content distribution of halogen atoms and/or electrical conductivity control material in the heating resistor layer along the direction of its thickness can be achieved. Therefore, various desirable properties such as heat accumulation, heat dissipation, and substrate-resistor layer adhesion properties can be easily achieved.

The thermal recording heads according to the present invention will be described by way of examples hereinafter.

EXAMPLE 1

A heating resistor layer was formed on a major surface of a substrate consisting of a support of an alumina ceramic plate and a glazed layer formed thereon. The heating resistor layer was deposited using the apparatus of FIG. 5 according to glow discharge. $CF_4/Ar=0.5$ (volume ratio) was used as a source gas. Deposition conditions were given as in Table 1. During film formation, the opening of each valve and other conditions were kept unchanged. The heating resistor layer had a thickness given in Table 1.

An Al layer was formed by electron beam deposition on the resistor layer and was etched to obtain a desired shape, thereby forming a pair of electrodes.

Subsequently, a predetermined portion of the resistor layer was etched using an HF-based etching solution according to a photolithographic technique. In Example 1, the size of the resistor layer between the pair of electrodes was 200 μm×300 μm. A plurality of heating resistor elements were formed on a single substrate such that seven heating elements were formed between each pair of electrodes in the longitudinal direction to constitute a thermal head.

An electrical resistance of each resultant heating resistor element of the thermal head was measured to be 85 Ω.

An electrical pulse signal was supplied to each heating resistor element of the thermal head to measure its durability. A duty cycle of the electrical pulse signal was 50%, an applied voltage was 6V, and drive frequency was 0.5 kHz, 1.0 kHz and 2.0 kHz.

When the heating resistor elements were driven at different frequencies, they were not damaged even after the number of electrical pulse signal inputs reached $1\times10^{10}$, and their resistances remained substantially unchanged in each case.

Character printing with a 5 (row)×7 (column) dot matrix was performed on a heat-sensitive sheet, and no dot omissions occurred even after $2\times10^9$ characters were printed. When the thermal head of Example 1 was also applied to a thermal transfer printer for printing characters on recording paper through a heat-sensitive transfer ink ribbon, good durability results were obtained.

When recording was then performed using a rough surface sheet, i.e., a so-called typing sheet, the thermal head of Example 1 had better durability than that of the conventional thermal head. More particularly, printing errors occurred in the conventional thermal head after 30,000,000 characters had been printed. However, such printing errors did not occur in the thermal head of Example 1 after 30,000,000 characters had been printed.

EXAMPLE 2

A heating resistor layer was formed in Example 2 in the same manner as in Example 1 except that $C_2F_6/Ar=0.2$ (volume ratio) and discharge power of 2 W/cm² were used.

A thermal head was prepared in the same manner as in Example 1, and an electrical pulse signal was applied thereto. Even after the number of electrical pulse signal inputs reached $1\times10^{10}$, the heating resistor elements were not damaged. Their resistances remained substantially unchanged.

Printing was then performed on heat-sensitive paper, subsequently as a thermal transfer type and then on a typing sheet as in Example 1. The thermal head of Example 2 had excellent durability, equivalent to that of Example 1.

EXAMPLE 3

A heating resistor layer was formed on a substrate consisting of a support of an alumina ceramic plate and a glazed layer formed thereon. The heating resistor layer was deposited by sputtering using the apparatus shown in FIG. 5. A sputtering target was graphite having 99.9% purity or higher, and $CF_4/Ar=0.5$ (volume ratio) was used as the source gas. The deposition conditions were given as in Table 1. During deposition, the opening of each valve and other conditions were held unchanged, thereby preparing a heating resistor layer of a thickness shown in Table 1.

A thermal head was then prepared using the heating resistor elements in the same manner as in Example 1. An electrical pulse signal was supplied to the heating resistor elements of the thermal head to perform printing. The thermal head of Example 3 had excellent durability equivalent to that of Example 1.

EXAMPLE 4

A thermal resistor element was prepared in the same manner as in Example 1, except that deposition conditions were given as in Table 2 and that the opening of the corresponding valve was continuously changed to change the flow rate of $CF_4/Ar$ gas during deposition.

An electrical resistance of each heating resistor element constituting a thermal head was measured to be 90 Ω.

An electrical pulse signal was supplied to each heating resistor element of the thermal head of Example 4 to measure its durability. A duty of the electrical pulse signal was 50%, an applied voltage was 6V, and drive frequency was 0.5 kHz, 1.0 kHz and 2.0 kHz.

When the heating resistor elements were driven at the different drive frequencies, they were not damaged even after the number of electrical pulse signal inputs reached $1\times10^{10}$, and their resistances remained substantially the same in each case.

Character printing with a 5 (row)×7 (column) dot matrix was performed on heat-sensitive sheet, and omissions occurred even after $2\times10^9$ characters were printed. When the thermal head of Example 4 was also applied to a thermal transfer printer for printing characters on recording paper through a heat-sensitive transfer ink ribbon, good durability results were obtained.

When recording was then performed using a rough surface sheet, i.e., a so-called typing sheet, the thermal head of Example 4 had better durability than that of the conventional thermal head. More particularly, printing errors occurred in the conventional thermal head after 30,000,000 characters had been printed. However, such printing errors did not occur in the thermal head of Example 1 after 30,000,000 characters had been printed.

EXAMPLE 5

A heating resistor layer was formed in Example 5 in the same manner as in Example 4 except that $C_2F_6/Ar=0.2$ (volume ratio) and discharge power of 2 W/cm² were used.

A thermal head was prepared in the same manner as in Example 4, and an electrical pulse signal was applied thereto. Even after the number of electrical pulse signal inputs reached $1\times10^{10}$, the heating resistor elements were not damaged. Their resistances remained substantially unchanged.

Printing was then performed on heat-sensitive paper, subsequently as a thermal transfer type and then on typing sheets as in Example 4. The thermal head of Example 5 had excellent durability equivalent to that of Example 4.

EXAMPLE 6

A heating resistor layer was formed in the same manner as in Example 3 except that deposition conditions in Table 2 were used and that the opening of the valve during deposition was continuously changed to change the flow rate of $CF_4/Ar$ gas. A heating resistor element was prepared using the resultant resistor layer.

A thermal head was then prepared using the heating resistor elements in the same manner as in Example 4. An electrical pulse signal was supplied to the heating resistor elements of the thermal head to perform printing. The thermal head of Example 6 had excellent durability equivalent to that of Example 4.

EXAMPLE 7

A heating resistor layer was formed and a heating resistor element was then prepared using the resultant heating resistor layer in the same manner as in Example 1, except that $CF_4/Ar=0.5$ (volume ratio) and $BF_3/Ar=1,000$ ppm (volume ratio) were used as source gases, and that deposition conditions were given as in Table 3.

An electrical resistance of each resultant heating resistor element of the thermal head was measured to be 80 Ω.

An electrical pulse signal was supplied to each heating resistor element of the thermal head to measure its durability. A duty of the electrical pulse signal was 50%, an applied voltage was 6V, and drive frequency was 0.5 kHz, 1.0 kHz and 2.0 kHz.

When the heating resistor elements were driven at different frequencies, they were not damaged even after the number of electrical pulse signal inputs reached $1\times 10^{10}$, and their resistance remained substantially unchanged in each case.

Character printing with a 5 (row)×7 (column) dot matrix was performed on heat-sensitive sheet, and no dot omissions occurred even after $2\times 10^9$ characters were printed. When the thermal head of Example 7 was also applied to a thermal transfer printer for printing characters on recording paper through a heat-sensitive transfer ink ribbon, good durability results were obtained.

When recording was then performed using a rough surface sheet, i.e., a so-called typing sheet, the thermal head of Example 7 had better durability than that of the conventional thermal head. More particularly, printing errors occurred in the conventional thermal head after 30,000,000 characters had been printed. However, such printing errors did not occur in the thermal head of Example 7 after 30,000,000 characters had been printed.

EXAMPLE 8

A heating resistor layer was formed in Example 8 in the same manner as in Example 7 except that $CF_4/Ar=0.5$ (volume ratio) and $PF_5/Ar=1,000$ ppm (volume ratio) were used.

A thermal head was prepared in the same manner as in Example 7, and an electrical pulse signal was applied thereto. Even after the number of electrical pulse signal inputs reached $1\times 10^{10}$, the heating resistor elements were not damaged. Their resistances remained substantially unchanged.

Printing was then performed on heat-sensitive paper, subsequently as a thermal transfer type and then on a typing sheet as in Example 7. The thermal head of Example 8 had excellent durability equivalent to that of Example 7.

EXAMPLE 9

A heating resistor layer was formed in the same manner as in Example 7 and a heating resistor element was then prepared using the resultant heating resistor layer, except that the opening of the corresponding valve was changed to change the flow rate of $CF_4/Ar$ gas, and that deposition conditions were given as in Table 4.

An electrical resistance of each resultant heating resistor element of the thermal head was measured to be 85 Ω.

An electrical pulse signal was supplied to each heating resistor element of the thermal head to measure durability thereof. A duty of the electrical pulse signal was 50%, an applied voltage was 6V, and drive frequency was 0.5 kHz, 1.0 kHz and 2.0 kHz.

When the heating resistor elements were driven at different frequencies, they were not damaged even after the number of electrical pulse signal inputs reached $1\times 10^{10}$, and their resistance remained substantially unchanged in each case.

Character printing with a 5 (row)×7 (column) dot matrix was performed on heat-sensitive sheet, and no dot omissions occurred even after $\times 10^9$ characters were printed. When the thermal head of Example 9 was also applied to a thermal transfer printer for printing characters on recording paper through a heat-sensitive transfer ink ribbon, good durability results were obtained.

When recording was then performed using a rough surface sheet, i.e., a so-called typing sheet, the thermal head of Example 9 had better durability than that of the conventional thermal head. More particularly, printing errors occurred in the conventional thermal head after 30,000,000 characters had been printed. However, such printing errors did not occur in the thermal head of Example 9 after 30,000,000 characters had been printed.

EXAMPLE 10

A heating resistor layer of the same thickness was formed in Example 10 in the same as Example 9 except that $CF_4/Ar=0.5$ (volume ratio) and $PF_5/Ar$ were used.

A thermal head was prepared in the same manner as in Example 9, and an electrical pulse signal was applied thereto. Even after the number of electrical pulse signal inputs reached $1\times 10^{10}$, the heating resistor elements were not damaged. Their resistances remained substantially unchanged.

Printing was then performed on heat-sensitive paper, subsequently as a thermal transfer type and then on a typing sheet as in Example 9. The thermal head of Example 10 had excellent durability equivalent to that of Example 9.

TABLE 1

| Example No. | Source Gas | Flow rate (SCCM) | Discharge power (W/cm$^2$) | Substrate temperature (°C.) | Film thickness (Å) |
|---|---|---|---|---|---|
| 1 | $CF_4/Ar = 0.5$ | 50 | 1 | 350 | 1000 |
| 2 | $C_2F_6/Ar = 0.2$ | 50 | 2 | 350 | 1000 |

TABLE 1-continued

| Example No. | Source Gas | Flow rate (SCCM) | Discharge power (W/cm²) | Substrate temperature (°C.) | Film thickness (Å) |
|---|---|---|---|---|---|
| 3 | CF$_4$/Ar = 0.5 | 20 | 5.5 | 350 | 1000 |

TABLE 2

| Example No. | Source Gas | Flow rate (SCCM) | Discharge power (W/cm²) | Substrate temperature (°C.) | Film thickness (Å) |
|---|---|---|---|---|---|
| 4 | CF$_4$/Ar = 0.5 | 50 → 20 | 1 | 350 | 1000 |
| 5 | C$_2$F$_6$/Ar = 0.2 | 50 → 20 | 2 | 350 | 1000 |
| 6 | CF$_4$/Ar = 0.5 | 20 → 10 | 5.5 | 350 | 1000 |

TABLE 3

| Example No. | Source Gas | Flow rate (SCCM) | Discharge power (W/cm²) | Substrate temperature (°C.) | Film thickness (Å) |
|---|---|---|---|---|---|
| 7 | CF$_4$/Ar = 0.5<br>BF$_3$/Ar = 1000 ppm | 50<br>125 | 1.5 | 350 | 1000 |
| 8 | CF$_4$/Ar = 0.5<br>PF$_5$/Ar = 1000 ppm | 50<br>125 | 1.5 | 350 | 1000 |

TABLE 4

| Example No. | Source Gas | Flow rate (SCCM) | Discharge power (W/cm²) | Substrate temperature (°C.) | Film thickness (Å) |
|---|---|---|---|---|---|
| 9 | CF$_4$/Ar = 0.5<br>BF$_3$/Ar = 1000 ppm | 50 → 70<br>125 | 1.5 | 350 | 1000 |
| 10 | CF$_4$/Ar = 0.5<br>PF$_5$/Ar = 1000 ppm | 50 → 70<br>125 | 1.5 | 350 | 1000 |

What is claimed is:

1. A thermal recording head comprising a heating resistor layer and at least a pair of electrodes electrically connected to said heating resistor layer, at least one combination of said heating resistor layer and said at least a pair of electrodes being formed on a substrate, wherein said heating resistor layer essentially consists of an amorphous material containing carbon atoms as a major constituent and halogen atoms, said halogen atoms nonuniformly distributed in the amorphous material.

2. A head according to claim 1, wherein a content of the halogen atoms in said heating resistor layer is 0.0001 to 30 atm %.

3. A heat according to claim 1, wherein the halogen atoms are one member selected from the group consisting of F and Cl.

4. A head according to claim 1, wherein said substrate has a surface layer at a heating resistor layer forming surface side, said surface layer being constituted by an amorphous material containing carbon atoms as a major constituent.

5. A head according to claim 1, wherein the halogen atoms are nonuniformly distributed along a direction of thickness of the heating resistor layer.

6. A head according to claim 5, wherein a control of the halogen atoms in said heating resistor layer is 0.0001 to 30 atm %.

7. A head according to claim 5, wherein the halogen atoms are one member selected from the group consisting of F and Cl.

8. A head according to claim 5, wherein said substrate has a surface layer at a heating resistor layer forming surface side, said surface layer being constituted by an amorphous material containing carbon atoms as a major constituent.

9. A head according to claim 5, wherein the halogen atoms are contained at a substrate side of said heating resistor layer at a higher concentration.

10. A head according to claim 5, wherein the halogen atoms are contained at a substrate side of said heating resistor layer at a lower concentration.

11. A head according to claim 5, wherein the halogen atoms are contained at a center of said heating resistor layer at a higher concentration.

12. A head according to claim 1, wherein the amorphous material contains an electrical conductivity control material.

13. A head according to claim 12, wherein a content of the halogen atoms in said heating resistor layer is 0.0001 to 30 atm %.

14. A head according to claim 12, wherein the halogen atoms are one member selected from the group consisting of F and Cl.

15. A head according to claim 12, wherein a content of the electrical conductivity control material in said heating resistor layer is 0.01 to 50000 atomic ppm.

16. A head according to claim 12, wherein the electrical conductivity control material is a Group III element.

17. A head according to claim 12, wherein the electrical conductivity control material is a Group V element.

18. A head according to claim 12, wherein said substrate has a surface layer at a heating resistor layer forming surface side, said surface layer being constituted by an amorphous material containing carbon atoms as a major constituent.

19. A head according to claim 12, wherein the halogen atoms and/or the electrical conductivity control material is nonuniformly distributed along a direction of thickness of said heating resistor layer.

20. A head according to claim 19, wherein a content of the halogen atoms in said heating resistor layer is 0.0001 to 30 atm %.

21. A head according to claim 19, wherein the halogen atoms are one member selected from the group consisting of F and Cl.

22. A head according to claim 19, wherein a content of the electrical conductivity control material in said heating resistor layer is 0.01 to 50,000 atomic ppm.

23. A head according to claim 19, wherein the electrical conductivity control material is a Group III element.

24. A head according to claim 19, wherein the electrical conductivity control material is a Group V element.

25. A head according to claim 19, wherein said substrate has a surface layer at a heating resistor layer forming surface side, said surface layer being constituted by an amorphous material containing carbon atoms as a major constituent.

26. A head according to claim 19, wherein the halogen atoms and/or the electrical conductivity control material is contained at a substrate side of said heating resistor layer at a higher concentration.

27. A head according to claim 19, wherein the halogen atoms and/or the electrical conductivity control material is contained at a substrate side of said heating resistor layer at a lower concentration.

28. A head according to claim 19, wherein the halogen atoms and/or the electrical conductivity control material is contained at a center of said heating resistor layer at a higher concentration.

29. A head according to claim 19, wherein the halogen atoms and the electrical conductivity control material have different distribution curves.

30. A head according to claim 19, wherein the halogen atoms and the electrical conductivity control material have an identical distribution curve.

* * * * *

UNITED STATES PATENT AND TRADEMARK OFFICE
CERTIFICATE OF CORRECTION

PATENT NO. : 4,804,974
DATED : February 14, 1989
INVENTOR(S) : MASAO SUGATA, ET AL.

It is certified that error appears in the above-identified patent and that said Letters Patent is hereby corrected as shown below:

COLUMN 2

Line 28, "according" should read --according to--.

COLUMN 3

Line 1, "dissipated" should read --heat dissipated--.

COLUMN 13

Line 55, "heat" should read --head--.
Line 66, "control" should read --content--.

Signed and Sealed this

Twenty-third Day of January, 1990

Attest:

JEFFREY M. SAMUELS

Attesting Officer     Acting Commissioner of Patents and Trademarks